(12) United States Patent
Towfiq et al.

(10) Patent No.: US 10,976,359 B2
(45) Date of Patent: Apr. 13, 2021

(54) FUNCTIONAL VERIFICATION PROCESS AND UNIVERSAL PLATFORM FOR HIGH-VOLUME REVERSE LOGISTICS OF CPE DEVICES

(71) Applicant: Promptlink Communications, Inc., Oceanside, CA (US)

(72) Inventors: Foad Towfiq, Vista, CA (US); Adib Towfiq, Vista, CA (US); Alexander Podarevsky, Oceanside, CA (US); Antonin Shtikhlaytner, Kiev (UA)

(73) Assignee: Promptlink Communications, Inc., Oceanside, CA (US)

( * ) Notice: Subject to any disclaimer, the term of this patent is extended or adjusted under 35 U.S.C. 154(b) by 371 days.

(21) Appl. No.: 13/987,766

(22) Filed: Aug. 29, 2013

(65) Prior Publication Data
US 2018/0299502 A1   Oct. 18, 2018

Related U.S. Application Data

(60) Provisional application No. 61/743,359, filed on Sep. 1, 2012, provisional application No. 61/795,857, filed on Oct. 27, 2012.

(51) Int. Cl.
*G01R 31/00*   (2006.01)
*G01R 31/28*   (2006.01)
*G06Q 30/00*   (2012.01)

(52) U.S. Cl.
CPC ....... *G01R 31/2825* (2013.01); *G06Q 30/018* (2013.01)

(58) Field of Classification Search
CPC ........... G01R 31/2825; G01R 31/2808; G01R 31/2868; G01R 31/2865; G01R 31/2893; G01R 31/31905; G01R 31/31914; G01R 31/31728; G01R 31/31718; G01R 31/40; G01R 31/02; G01R 31/26; H05K 1/181; H05K 1/0213; G06F 11/22; G06F 15/177; G06Q 30/018
See application file for complete search history.

(56) References Cited

U.S. PATENT DOCUMENTS

| 4,450,335 A | 5/1984 | Shimizu et al. |
| 5,010,446 A * | 4/1991 | Scannell ................. G01R 1/06 324/763.01 |

(Continued)

OTHER PUBLICATIONS

International Preliminary Report on Patentability received for PCT Patent Application No. PCT/US2013/000201, dated Mar. 12, 2015, 6 pages.

(Continued)

*Primary Examiner* — Thang X Le
(74) *Attorney, Agent, or Firm* — Dentons US LLP (57) ABSTRACT

A customer premise equipment (CPE) device may be functionally verified using a universal platform to simulate operating conditions of an environment in which the CPE is intended to operate. Functional verification may be performed for an operational use of a CPE device in an environment similar to that used by customers of a service provider. Functional verification may be applied to a variety of devices using a verification platform that can support various types of CPE devices, various models of CPE devices, and various operational configurations used by an operator.

14 Claims, 5 Drawing Sheets

(56) References Cited

U.S. PATENT DOCUMENTS

| | | | |
|---|---|---|---|
| 5,528,161 A * | 6/1996 | Liken | G01R 31/2808 |
| | | | 324/750.14 |
| 6,434,606 B1 | 8/2002 | Borella et al. | |
| 6,741,277 B1 | 5/2004 | Rau | |
| 7,058,559 B1 | 6/2006 | Roeck et al. | |
| 7,668,397 B2 | 2/2010 | Le Dinh et al. | |
| 7,894,349 B2 | 2/2011 | Breed et al. | |
| 9,755,766 B2 | 9/2017 | Wadell et al. | |
| 10,033,618 B1 | 7/2018 | Grinkenneyer et al. | |
| 10,419,957 B2 | 9/2019 | Towfiq et al. | |
| 2001/0011375 A1 | 8/2001 | Yun | |
| 2002/0091966 A1* | 7/2002 | Barton | G06F 11/006 |
| | | | 714/25 |
| 2003/0101391 A1 | 5/2003 | Man et al. | |
| 2003/0149991 A1 | 8/2003 | Reidhead et al. | |
| 2003/0229695 A1 | 12/2003 | McBride | |
| 2004/0054771 A1 | 3/2004 | Roe et al. | |
| 2004/0160226 A1* | 8/2004 | Ewing | G01R 31/2808 |
| | | | 324/538 |
| 2005/0060612 A1 | 3/2005 | Bohan | |
| 2005/0183130 A1 | 8/2005 | Sadja et al. | |
| 2005/0240852 A1 | 10/2005 | Inaba et al. | |
| 2006/0023845 A1 | 2/2006 | Brumble | |
| 2006/0085158 A1* | 4/2006 | Cakiner | G06F 11/22 |
| | | | 702/121 |
| 2006/0101495 A1 | 5/2006 | Yoshida et al. | |
| 2006/0233228 A1 | 10/2006 | Liang | |
| 2007/0074261 A1 | 3/2007 | Bowen et al. | |
| 2007/0242420 A1 | 10/2007 | Hoshino et al. | |
| 2007/0247331 A1 | 10/2007 | Angelis et al. | |
| 2008/0034385 A1 | 2/2008 | Cruickshank et al. | |
| 2008/0038098 A1* | 2/2008 | Ito | G01R 31/31718 |
| | | | 414/222.01 |
| 2008/0168520 A1 | 7/2008 | Vanderhoff et al. | |
| 2009/0013372 A1 | 1/2009 | Oakes et al. | |
| 2009/0089854 A1 | 4/2009 | Le et al. | |
| 2009/0092053 A1 | 4/2009 | Olgaard | |
| 2009/0168658 A1 | 7/2009 | Russell et al. | |
| 2009/0195658 A1 | 8/2009 | Deschamp | |
| 2009/0282446 A1* | 11/2009 | Breed | H04L 43/50 |
| | | | 725/106 |
| 2009/0319249 A1 | 12/2009 | White et al. | |
| 2010/0178875 A1 | 7/2010 | Oh et al. | |
| 2010/0261431 A1 | 10/2010 | Olgaard | |
| 2011/0069624 A1 | 3/2011 | Olgaard | |
| 2011/0072306 A1* | 3/2011 | Racey | G06F 11/273 |
| | | | 714/27 |
| 2011/0202645 A1 | 8/2011 | Abdelal et al. | |
| 2012/0126823 A1 | 5/2012 | Lussier | |
| 2012/0140081 A1 | 6/2012 | Clements | |
| 2012/0151549 A1 | 6/2012 | Kumar et al. | |
| 2012/0226462 A1 | 9/2012 | Rucker | |
| 2012/0246083 A1 | 9/2012 | Bowles et al. | |
| 2012/0278657 A1 | 11/2012 | Baker et al. | |
| 2012/0307982 A1 | 12/2012 | Faulkner et al. | |
| 2012/0320784 A1 | 12/2012 | Edwards et al. | |
| 2013/0004179 A1 | 1/2013 | Nielsen et al. | |
| 2013/0007520 A1 | 1/2013 | Giammarresi et al. | |
| 2013/0063606 A1* | 3/2013 | McClay | H04N 17/04 |
| | | | 348/181 |
| 2013/0093447 A1 | 4/2013 | Nickel et al. | |
| 2013/0128124 A1 | 5/2013 | Suzuki et al. | |
| 2013/0238308 A1 | 9/2013 | Grosso | |
| 2014/0181572 A1 | 6/2014 | Bradfield et al. | |
| 2014/0181849 A1 | 6/2014 | Casey et al. | |
| 2014/0233405 A1 | 8/2014 | Olgaard | |
| 2014/0240604 A1 | 8/2014 | Toba et al. | |
| 2014/0256268 A1 | 9/2014 | Olgaard | |
| 2014/0269470 A1 | 9/2014 | Hybertson et al. | |
| 2016/0140468 A1 | 5/2016 | Langborg-Hansen et al. | |
| 2016/0242104 A1 | 8/2016 | Wei | |
| 2018/0146384 A1 | 5/2018 | Towfiq | |
| 2019/0097910 A1 | 3/2019 | Towfiq | |
| 2019/0364268 A1 | 11/2019 | Towfiq et al. | |
| 2020/0015104 A1 | 1/2020 | Towfiq et al. | |

OTHER PUBLICATIONS

International Search Report and Written Opinion received for PCT Patent Application No. PCT/US2013/000201, dated Apr. 8, 2014, 7 pages.

International Search Report and Written Opinion received for PCT Patent Application No. PCT/US2013/000244, dated Mar. 21, 2014, 7 pages.

International Search Report and Written Opinion received for PCT Patent Application No. PCT/US2013/000283, dated Mar. 13, 2014, 8 pages.

International Search Report and Written Opinion received for PCT Patent Application No. PCT/US2013/000284, dated Aug. 25, 2014, 8 pages.

International Search Report and Written Opinion received for PCT Patent Application No. PCT/US2013/000285, dated Mar. 13, 2014, 8 pages.

Non-Final Office Action received for U.S. Appl. No. 14/278,028, dated Mar. 29, 2018, 9 pages.

Non-Final Office Action received for U.S. Appl. No. 14/544,387, dated Mar. 11, 2019, 16 pages.

Notice of Allowance received for U.S. Appl. No. 14/278,028, dated Jan. 9, 2019, 6 pages.

Notice of Allowance received for U.S. Appl. No. 14/278,028, dated May 2, 2019, 5 pages.

International Preliminary Report on Patentability received for PCT Patent Application No. PCT/US2013/000244, dated Jun. 18, 2015, 6 pages.

Supplemental Notice of Allowance received for U.S. Appl. No. 14/278,028, dated May 23, 2019, 2 pages.

"19-Inch Rack—Wikipedia", Available Online at: <https://en.wikipedia.org/wiki/19-inch_rack>, Sep. 20, 2019, pp. 1-10.

Final Office Action received for U.S. Appl. No. 13/998,949, dated Jul. 15, 2020, 14 pages.

Final Office Action received for U.S. Appl. No. 14/544,387, dated Sep. 26, 2019, 17 pages.

Non-Final Office Action received for U.S. Appl. No. 13/998,949, dated Dec. 20, 2019, 11 pages.

Non-Final Office Action received for U.S. Appl. No. 16/572,477, dated Sep. 3, 2020, 9 pages.

Notice of Allowance received for U.S. Appl. No. 14/544,387, dated Oct. 21, 2020, 9 pages.

* cited by examiner

FUNCTIONAL VERIFICATION PROCESS AND UNIVERSAL PLATFORM FOR HIGH-VOLUME REVERSE LOGISTICS OF CPE DEVICES

TECHNICAL FIELD

This disclosure relates generally to electronic device testing. The present application claims priority from U.S. Provisional Patent Application Ser. No. 61/743,359 filed on Sep. 1, 2012, entitled "Functional Verification Process and Universal Platform for High-Volume Reverse Logistics of CPE Devices," the entire disclosure of which is herein incorporated by reference. The present application also claims priority from U.S. Provisional Patent Application Ser. No. 61/795,857 filed on Oct. 27, 2012, entitled "Quick Connection of Multiple Interfaces using Multi-Pin Cable and Connectors to Support High-Volume Testing of Devices with a Plurality of Interfaces," the entire disclosure of which is herein incorporated by reference. The present application also claims priority from U.S. Provisional Patent Application Ser. No. 61/851,971 filed on Mar. 14, 2013, entitled "Automated Management of Devices Under Test Using RFID and/or NFC Tags," the entire disclosure of which is herein incorporated by reference.

BACKGROUND

Service providers, including but not limited to communications, connectivity, and content service providers, may provide multimedia services, such as video, audio, telephony, data communications, wireless networking, and related services to their subscribers by deploying equipment or devices at their customers' premises, and then connecting this equipment to the service provider's network and infrastructure. The deployed devices are generally called Customer Premise Equipment (CPE). For example, cable companies, more commonly known as multiple system operators (MSOs), deliver their service to customers by connecting a device, such as a set-top box or a cable modem, to their network. This CPE device may act as the service delivery mechanism for the subscriber.

The logistics of managing deployment of CPE devices may be a key operational business process for some service providers (for example, ISPs, Wi-Fi network providers, MSOs, satellite TV companies, DSL vendors, telecommunications companies, etc.). Providers may select CPE devices based on the technical qualifications of the CPE devices, and providers purchase millions of CPE devices each year to use for delivering their subscription services to their customers. CPE devices may include TV set-top boxes, cable modems, Embedded Multimedia Terminal Adapters (EMTAs), wireless gateways, DSL modems, and/or devices that combine any of these capabilities, and possibly other capabilities, in an integrated package. Large quantities of CPE devices are in use, and the devices are growing more complex as they aim to deliver more valuable services.

Service providers may use warehouses to act as distribution facilities that manage the stock of CPE devices. These warehouses may manage a stock of new and used CPE devices, and to increase the investment in these CPE devices, service providers may attempt to put every used CPE device back into service at a new location. A CPE device may be considered used when it has been deployed to a customer and has been returned to the warehouse for any of a variety of reasons.

When the warehouse receives field returns, as part of Reverse Logistics process, the returned CPE devices may be tested to determine if they still work properly. If they work, they may be put back into stock for re-deployment to customer premises. If not, they may be evaluated if they remain under warranty, so that they may be returned to the manufacturer for warranty repair or replacement. Similarly, if they need non-warranty repair, they may be delivered to internal or third party repair facilities.

The logistics process may be related to stocking, deploying, receiving field returns, testing, evaluating, and/or determining the final disposition of these CPE devices. It can be an important process because it can represent a large part of the operational costs for the service provider, and the quality of the work performed can directly affect the level of customer satisfaction and the related per customer revenue. The logistics process may be characterized by a number of issues. For example, some issues may include, but are not limited to: managing the manual handling of thousands of devices each day to maintain adequate device stocks; supporting many types of devices; supporting many different vendors and many different vendor models; performing expert-level technical analysis of returned devices, which can be expensive and/or time consuming, while Reverse Logistics, like most warehouse processes, may flow quickly in high-volumes to keep up with demand; limited access or scarce availability of high-cost testing systems; and/or integrating the informatics of thousands of devices that are the manually handled with the electronic operations systems that support deployment tasks, warehouse supply management, and warranty or'repair processes.

A need continues to exist for systems and processes that support the Reverse Logistics process in terms of high-volume processing of CPE devices, the optimization of the use of testing systems, the automation of the testing process, the automation of capturing device and test result information, and/or the exchange with external systems or presentation of device and test result information to logistics personnel.

The inventor draws upon knowledge of the engineering practice of functional verification, in which compliance to requirements for the functionality can be shown, and thus, that different designs could achieve the intended functionality. Functional verification does not need to show that one design more correct than any other, just that a specific design is verified to supply the intended functionality. This definition of functional verification is applied by analogy to a device evaluation process in which CPE devices are intended (by service providers and their customers) to be used in a general operational environment, and thus, the CPE devices can be verified generally to demonstrate this intended functionality or ability to operate in the given environment.

By applying the analogy of a functional verification process to high-volume CPE device evaluation leads to a process innovation in which the discrete and inflexible device testing process is replaced with a high-volume, flexible functional verification process. Functional verification is associated originally with electronic design automation, where electronic circuit and system designs were intended to produce certain functionality, while it acknowledges many different designs could demonstrate the intended functionality. The original verification process allowed the verification of an electronic circuit and system design as appropriate for supplying the desired functionality, without necessarily evaluating the design for other characteristics such as most efficient power consumption, lowest cost of components, maintainability, etc. The analogy of applying this process to high-volume CPE device evaluation quickly and efficiently shows that devices are operational or not, without wasting time diagnosing a problem (that simply may not exist in otherwise operational devices that happen to have been deployed to the field and then returned).

The invention applies the functional verification concept to the process of evaluating the ability of CPE devices to operate as expected or intended. The invention benefits the content service provider by empowering high-volume device processing, lowering the cost of their Reverse Logistics process.

One aspect of the invention is that by applying the model of functional verification, the universal platform is faster and more efficient than more elaborate testing systems. In order to enable scaling to high volumes, another aspect of the invention is innovation to streamline the workflow process, such as:

Moving manual processing (connecting and disconnecting cables) to offline locations away from the online, active test platform.

Perform manual processing with offline rolling racks to easily load devices, roll the rack into the online, active test platform area with loaded devices, and reverse the process when testing is done, rolling the rack out of the online area, for offline unloading.

Quick connect whole rolling racks with minimal numbers of bundled, aggregated connections.

Accelerate and maximize efficiency of user interaction with the universal platform through use of wireless mobile terminal with scanning capability in place of keystroke data entry and ordinary barcode scanning.

Exercise control over the functional verification and workflow process and deliver operator instructions through system software that delivers information to operators through the wireless mobile terminal, as well as ubiquitous web browser reports.

To summarize the invention, in spite of the strength of current automated test systems, in order to have a scalable process, innovations are needed in both improving the speed of testing and evaluation that determines which devices are functional (functional verification), and improving the device handling process surrounding the test system.

SUMMARY OF THE DISCLOSURE

According to the disclosed subject matter, Customer Premise Equipment (CPE) devices may be verified using a universal platform for simulating operating conditions of the environment in which the CPE devices are intended to operate. CPE devices, such as set-top boxes, DSL modems, cable modems, Embedded Multimedia Terminal Adapters (EMTAs), wireless gateways, and combined function devices, such as DOCSIS set-top boxes with wireless network gateways or IPTV set-top boxes with multimedia terminal adapters, may be treated as commodities that are verified to behave as the customer intends within an operational environment that may be associated with the customer's premises, and related to the service they subscribe to from the content service provider.

A method of conducting functional verification of a customer premise equipment (CPE) device may involve loading the CPE device on a test apparatus comprising a first connector interface, electrically connecting the CPE device to the test apparatus, using a cable to electrically connect the first connector interface to a corresponding second connector interface of a test platform, performing a functional verification test of the CPE device, disconnecting the first connector interface from the second connector interface, electrically disconnecting the CPE device from the test apparatus, and unloading the CPE device from the test apparatus.

A method of conducting functional verification of CPE devices may involve loading a plurality of CPE devices on a plurality of test apparatuses, each test apparatus comprising a respective first connector interface, electrically connecting the CPE devices to the test apparatuses, electrically connecting the first connector interfaces to corresponding second connector interfaces of a test platform, performing functional verification tests of the CPE devices, disconnecting the first connector interfaces from the second connector interfaces, electrically disconnecting the CPE devices from the test apparatus, and unloading the CPE devices from the test apparatus. One or more of these steps may be performed in parallel.

A testing apparatus may comprise a central node configured to perform functional verification of customer premise equipment (CPE) devices and a plurality of testing apparatuses. Each testing apparatus may comprise a shelf configured to be electrically connected to a respective CPE device and to the central node.

A universal platform is constructed with software that implements one instance of the device evaluation logic needed for functional verification of the device, while the software remains configurable to allow different logic to be executed for the same or different devices. A universal platform relies upon software to perform repetitive workflow tasks, and to execute dynamic decisions in the workflow based on many variables, such as test apparatus parameters, conditions of the device, selection of available evaluation processes, and other control inputs, as well as the actual results of specific evaluation tests. A universal platform uses software in one configuration instance at a time, and dynamically adjusts the configuration by selecting different software configurations to load and execute on the testing apparatus in response to changing conditions (for example, connection of a different model device to the testing apparatus). A universal platform executes software that configures test patterns for different types of devices and interfaces, and configures specific tests themselves to be applied. A universal platform executes software that automatically records user, device and test platform asset management metrics prior to running tests, then it runs the tests, collects results, and organizes both asset management of the device and reporting for users and managers of the results. A universal platform designed for current and future functional verification makes use of flexible software scripts that readily embody process workflow in executable lines of the scripts, and also readily allow re-configuration of the scripts to alter the process workflow of the functional verification process, as needed for support of different devices, interfaces, test algorithms, and evaluation of intended functionality.

A method to increase the universal platform capacity to support a higher volume of CPE devices can be the addition of more testing apparatuses, especially rolling rack test apparatuses that enable most efficient use of the active central node for active, online testing, while allowing offline manual loading and unloading of CPE devices to/from the rolling rack test apparatuses. This method to support higher volumes can be called scalable functional verification with a universal platform.

BRIEF DESCRIPTION OF THE DRAWINGS

A more detailed understanding may be had from the following description, given by way of example in conjunction with the accompanying drawings, in which.

DETAILED DESCRIPTION

The disclosed subject matter is described with specificity to meet statutory requirements. However, the description itself is not intended to limit the scope of this patent. Rather, it is contemplated that the claimed subject matter might also be embodied in other ways, to include different steps or combinations of steps similar to the ones described in this document, in conjunction with other present or future technologies.

According to the disclosed subject matter, Customer Premise Equipment (CPE) devices may be verified using a universal platform for simulating operating conditions of the environment in which the CPE devices are intended to operate. CPE devices, such as set-top boxes, DSL modems, cable modems, Embedded Multimedia Terminal Adapters (EMTAs), wireless gateways, and combined function devices, such as DOCSIS set-top boxes with wireless network gateways or IPTV set-top boxes with multimedia terminal adapters, may be treated as commodities that are verified to behave as the customer intends within an operational environment that may be associated with the customer's premises, and related to the service they subscribe to from the content service provider.

The disclosed subject matter may perform a form of functional verification for an operational use of a CPE device in an environment similar to that used by customers of the network service provider and may apply this functional verification process to a variety of devices through the use of a verification platform that can be adapted to support various CPE devices, various CPE device models from a variety of vendors, and various operators' specific operational configurations.

A platform may be adapted for testing and evaluating a variety of CPE devices or for verifying a plurality of CPE functions when the relevant devices are combined function devices. To enable an efficient functional verification process and enable a high volume of devices to be processed, a broad platform may be used that allows a variety of device types, or devices with a plurality of capabilities, or devices from a variety of vendors, to be connected. A verification platform may be used for a plurality of CPE devices.

An operator's process may automate data entry through the use of a mobile terminal with scanners for machine-readable identifiers, such as optical barcodes, radio frequency identifiers (RFIDs), or near field communication (NFC) scanning at steps in the device processing, functional verification, evaluation of results, and disposition of the processed devices.

A platform may be defined as a system having multiple components, including a central node that may operate active test and verification processors to which may be connected freely movable rolling racks that may house CPE devices. The system may use multiple rolling racks that cycle, e.g., continually cycle, through usage modes, of loading devices, active testing of devices when the racks are connected to the central node, and unloading devices. Usage of the active testing system may be increased by using rolling racks to load or unload devices away from the active test system (e.g., the central node). The rolling racks and the platform may use quick connect cabling and quick connect connectors so that a rack loaded with devices may be connected to the active test system more quickly than loading or unloading CPE devices directly to/from the active test system. The use of rolling racks with quick connect cabling and connectors may facilitate loading and unloading devices away from the active test system. This may address an issue related to slow, manual loading of CPE devices that involves making many physical connections of each CPE device to the test system and may waste the high-value time of the testing system.

A process may be employed in functional qualification of CPE devices. Functional qualification may involve determining that a CPE device is able to meet its intended use for a qualified service. Functional qualification may apply functional verification to determine general operational ability and may add evaluation if quantitative service levels may be met by the operational device. For example, a cable modem can be functionally verified to perform on the service provider's network and deliver high speed digital data communications, but if the service provider seeks to deliver a premium subscription service of 20 Mbps and the cable modem cannot be qualified at this data rate, the functional qualification may be declined.

Functional qualification may involve categorizing functional verification and/or functional qualification results. Categories of results may include simple binary test results, such as pass or fail (which is the default set of possible results of functional verification). Functional qualification may involve additional categories to distinguish between different dispositions of functionally verified devices. There may be categories in addition to pass and fail for functional verification, e.g., warning and/or inconclusive. For example, functional verification may verify a pass result for operations capability of a set-top box, and then functional qualification may qualify that High Definition (HD) services are also operationally supported by the device.

Functional verification may be applied to determine that a device operates effectively within an intended operational environment, producing a base verification result. A functional qualification process may combine the base verification result with qualification results. Combining these processes may transform a pass or fail result into proof that a CPE device can or cannot attain certain specified performance thresholds and may qualify or decline to qualify a device.

High volumes of CPE devices may be matched with high performance parallel processing. High volume functional verification processing may involve a corresponding high volume operation of testing and/or evaluation, which may be related to high speed operation of the testing and/or evaluation functions commensurate with a high volume of CPE devices. High speed testing and/or evaluation may occur with the active test system operating highly parallel verification of operation of a plurality of relevant features of the CPE devices, tuned to the specific devices. For example, a TV set-top box with video, audio, and data communications functions may be matched to a platform's video capture, audio capture, and data communications capture capabilities. A CPE device under test and/or evaluation in the functional verification process may be matched with a specific test server with a plurality of capture capabilities associated with each test server. A parallel processing central node (e.g., an active test system) may be coupled with parallel functional verification capabilities on rolling racks, which may be consistent with high volume functional verification of CPE devices.

High volume operation of testing and/or evaluation may be correlated with commensurate data management techniques. Parallel processing of data, e.g., functional verification tests and/or test results, may be integrated with databases that support distribution of a plurality of central node databases for parallel processing of data; merging of a plurality of central node databases into a unified, comprehensive database; and/or active re-factoring of the parallel or unified databases. Data archiving may be used to reduce database size. Data indexing and/or compression may be used to retain access to historical, but archived, functional verification tests and/or test results. A parallel processing and actively managed database architecture (e.g., with parallel and/or unified database components) may be coupled with parallel functional verification capabilities, which may be consistent with high volume functional verification of CPE devices.

Functional verification may be employed to demonstrate that a device exhibits an intended functionality or intended functionalities and that a CPE device can be used in an operational environment. The disclosed subject matter may replace a discrete and inflexible testing process with a high-volume, flexible functional verification process. Functional verification may be used to evaluate the ability of CPE devices to operate as expected or intended. A content service provider may benefit from high-volume device processing and a potentially lower cost of a Reverse Logistics process.

Some conventional automated test systems use relatively elaborate diagnostic testing processes, which take more time to perform, while aiming at the goal of diagnosis of a problem in device under test. Fully functional devices that have been returned from field deployment may be quickly and cost-efficiently verified in their ability to operate properly without performing these slower, more expensive diagnostic testing processes.

The time needed to analyze if a device can be returned to service may be reduced. Further, functional verification can be used for a plurality of devices. Conventional diagnostic testing may involve the use of device tests and a device testing system that are able to perform comprehensive diagnostic functions on specific devices using associated specific tests and testers for specific device diagnostic tests. The disclosed subject matter may employ a universal platform for testing and evaluation for any CPE devices to supplement the functional verification process by enabling a plurality of devices to be processed. In the service provider's Reverse Logistics process, less time will be needed to sort and route returned CPE devices to the correct test harness. The universal platform may facilitate time savings in manual handling of returned devices because the universal platform may be a destination for a plurality of returned CPE devices processed in the Reverse Logistics process.

An efficient functional verification process may be possible through the use of a universal platform that allows any type of device, or devices with various capabilities, or devices from any vendor, to be connected for functional verification. A high volume of devices may be processed through a functional verification process that uses a universal platform, which may make efficient use of the scarce resource of the active testing system.

A combined system and process innovation of rolling racks for loading and unloading may be part of the functional verification process with the universal platform. A system comprising a rolling rack with quick connect cabling and connectors may migrate the manual handling and connection and/or disconnection of devices away from the high-value time of the active testing system.

Rolling racks may be loaded away from an active testing system to make a queue of devices that may be ready for rapid connection. This may reduce wasted time of the testing system.

Rolling racks with quick connect cabling may act as a system that may improve the functional verification process and may increase the usage of the active testing system. Each device may have a number of cables to be connected, such as power, an interface for an upstream connection to a service provider, and/or a plurality of interfaces for video, audio, and/or data used by the customer. When the active test system is loaded with devices, each connection is made. Some conventional testing systems shut down the active test system while conducting the load of devices, creating an off-duty cycle that accompanies each active duty cycle while the tests run.

Moving the rolling racks to a separate location away from the test system to load or unload devices may allow more devices to be tested and verified. Rolling racks may improve the active duty cycle of the test system.

Connecting a rolling rack to the active test system with quick connect cabling and connectors may simplify the connection process, further reducing downtime. A rolling rack and universal platform may act together as a system that may benefit from quick connect cabling and connectors that may use two high-density cables to simply connect each device for active testing and verification.

A rolling rack may use shelves that are wired for a plurality of devices and that may act as the simulated customer premise of the universal platform. A CPE device may be placed on a shelf of the rolling rack and may be manually connected to the interfaces appropriate to the CPE device. A single rolling rack with, for example, eight shelves, may accommodate eight different types of devices, while the universal nature of the platform supports a variety of common or specific interfaces, e.g., coaxial cable for RF network interfaces, RJ-11 telephone interfaces, and/or a plurality of video interfaces.

Data entry may be automated using a mobile terminal, e.g., a handheld terminal, that may use a scanner or scanners that may read machine readable identifiers, including, but not limited to optical bar codes, quick response (QR) codes, radio frequency identifiers (RFIDs), or near field communication (NFC) scanning. The mobile terminal may display directions to an operator, guiding the operator through steps in a data entry process. The mobile terminal may use device-aware and/or platform-aware logic to assist the operator even if the process changes in response to dynamic information, e.g., if active testing has been completed, or if a new device is encountered that has not yet been evaluated.

A mobile terminal may scan devices as they are handled and loaded onto the universal platform. The mobile terminal may scan a machine readable identifier, such as a barcode, QR code, RFID, or NFC, of the loaded universal platform rack, marking the rack as ready for testing. As the rack is tested by the active test system, testing results may be recorded for the rack and for the devices loaded on it. The mobile terminal may be used again as operators unload the rack and sort the verified devices for return to stock, repair or warranty action, or discarding. The mobile terminal may automate the tracking and management of the information related to the device, and may reduce or eliminate incorrectly entered or missing data input for the functional verification process with the universal platform.

Functionally verifying CPE devices may be distinct from diagnostic testing that produces binary pass or fail results in that it may qualify devices with additional enumerated test results that show that the device is able or unable to meet its intended use for a qualified service. Functional qualification may evaluate whether a specific service level may be met by the operational device.

Functional qualification may add subjective value to basic verification results by adding enumerated designations of how well a CPE device may be functionally verified to perform on the service provider's network and deliver specific qualified services. Functional qualification may include the use of categorization of functional verification and functional qualification results.

Functional qualification may apply to functional verification for CPE devices and/or to testing and/or verification, which may include the platform, the mobile terminal, and/or the system design of rolling racks with a central node active test system. Functional verification may involve simpler, more efficient verification than conventional processes. Functional qualification may enhance and expand the utility of the basic CPE device functional verification results.

High volume Reverse Logistics processing of CPE devices may benefit from a high performance parallel processing test and verification platform. High volume functional verification processing may involve high performance testing and evaluation, which may be related to the use of parallel testing and evaluation infrastructure commensurate with a high volume of devices. High speed testing and evaluation may occur with the active test system operating highly parallel verification of CPE device operation.

A plurality of relevant features of the CPE devices may be tested and verified using broad capabilities of the platform, e.g., operation of video, audio, and/or data communication functions may be tested and verified.

High-speed verification may involve using a platform that has test capture capabilities to match the platform's plurality of video, audio, and/or data communications capabilities.

High-speed testing and evaluation may occur for a plurality of CPE devices under test and/or evaluation in the functional verification process. The high-speed provided by each device may be matched with a specific test server, for example, in a parallel configuration.

One or more test servers, e.g., each test server, may be associated with a plurality of capture devices to provide broad coverage of capabilities that can be functionally verified.

High-speed testing and/or evaluation may involve the coupling of a parallel processing testing node, e.g., an active test system, with parallel functional verification capabilities on rolling racks.

High-speed testing and/or evaluation may involve the correlation of verification operation information with commensurate data management techniques. Parallel processing of data, e.g., functional verification tests and/or test results, may be integrated with appropriately architected and/or designed databases to support high-speed verification.

An architecture and design of databases may be high-speed and scalable to distribute a plurality of central node databases for parallel processing of data, merge a plurality of central node databases into a unified, comprehensive database, and/or actively re-factor the parallel or unified databases. Data archiving may be used to reduce the database size. Data indexing and/or compression may be used to retain access to historical-yet-archived functional verification tests and/or test results.

A parallel processing and actively managed database architecture, e.g., with parallel and unified database components, may be coupled with parallel functional verification capabilities. This architecture may be consistent with high-volume functional verification of CPE devices.

Figure 1:
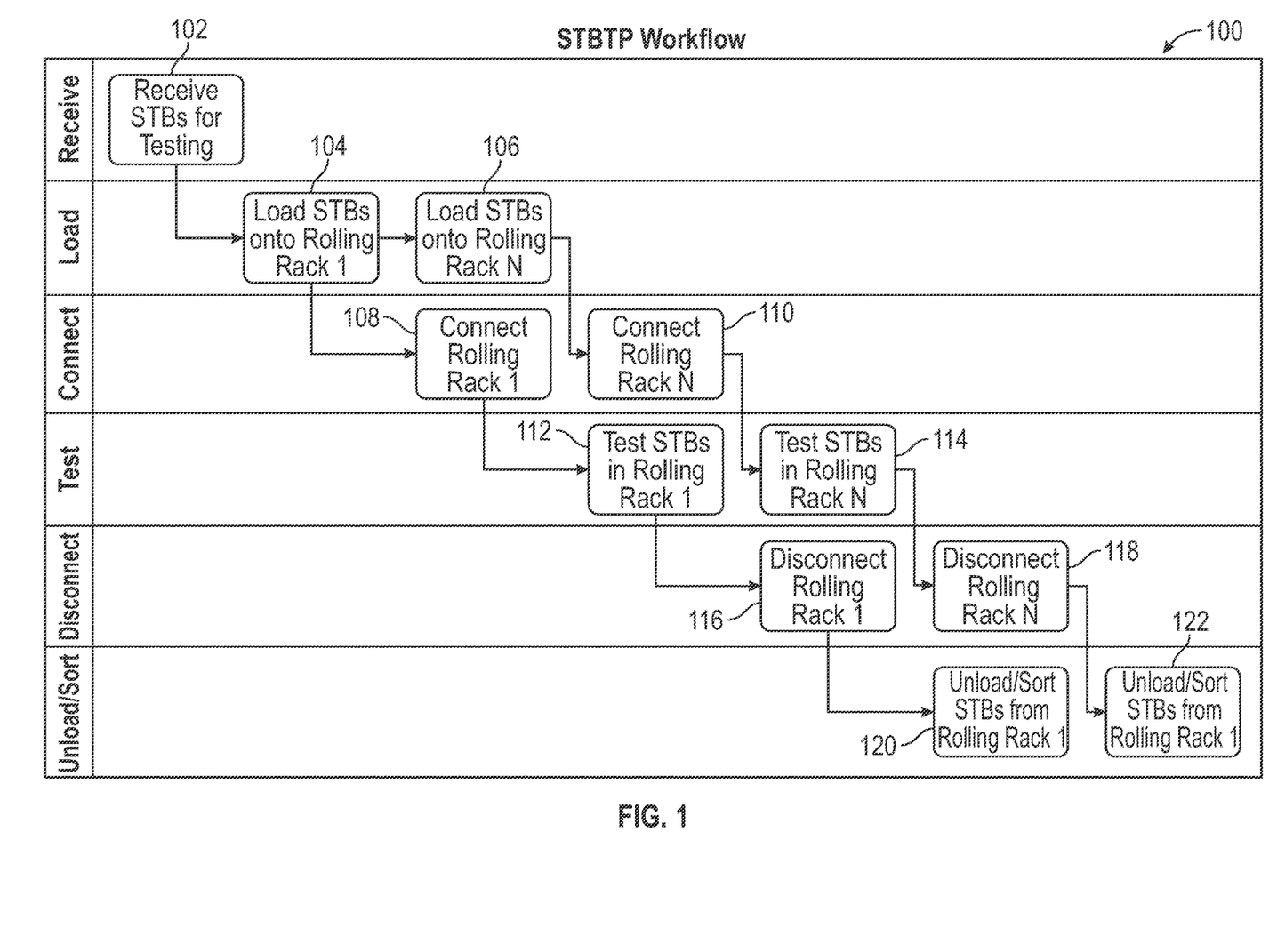
FIG. 1 is a block diagram depicting an example of workflow for high-volume functional verification of Customer Premise Equipment (CPE) devices according to the disclosed subject matter.

Referring now to the drawings, FIG. 1 illustrates an example process 100 for functional verification of set-top boxes (STBs). At 102, STBs may be received for testing. At 104 and 106, the STBs may be loaded on to rolling racks, for example, rolling racks 1 to N. At 108 and 110, the rolling racks, e.g., rolling racks 1 to N, may be connected to a testing platform. As shown in FIG. 1, the connection of the rolling racks may take place in parallel with the loading of the STBs on to the rolling racks. For example, an STB may be loaded onto a rolling rack while another rolling rack is connected to the testing platform. At 112 and 114, the STBs on rolling racks 1 to N may be tested. As shown in FIG. 1, the testing of the STBs on the rolling racks may take place in parallel with the connection of the rolling racks. For example, an STB on one rolling rack may be tested while another rolling rack is connected to the testing platform.

At 116 and 118, rolling racks 1 to N may be disconnected from the testing platform. As shown in FIG. 1, the disconnection of the rolling racks from the testing platform may take place in parallel with the testing of the STBs on the rolling racks. For example, a rolling rack may be disconnected while an STB on another rolling rack is being tested. At 120 and 122, the STBs may be unloaded from rolling racks 1 to N and sorted, for example, for return to stock, repair or warranty action, or discarding. As shown in FIG. 1, unloading and sorting may take place in parallel with the disconnection of the rolling racks. For example, an STB may be unloaded from a rolling rack and sorted while another rolling rack is disconnected from a testing platform.

Figure 2:
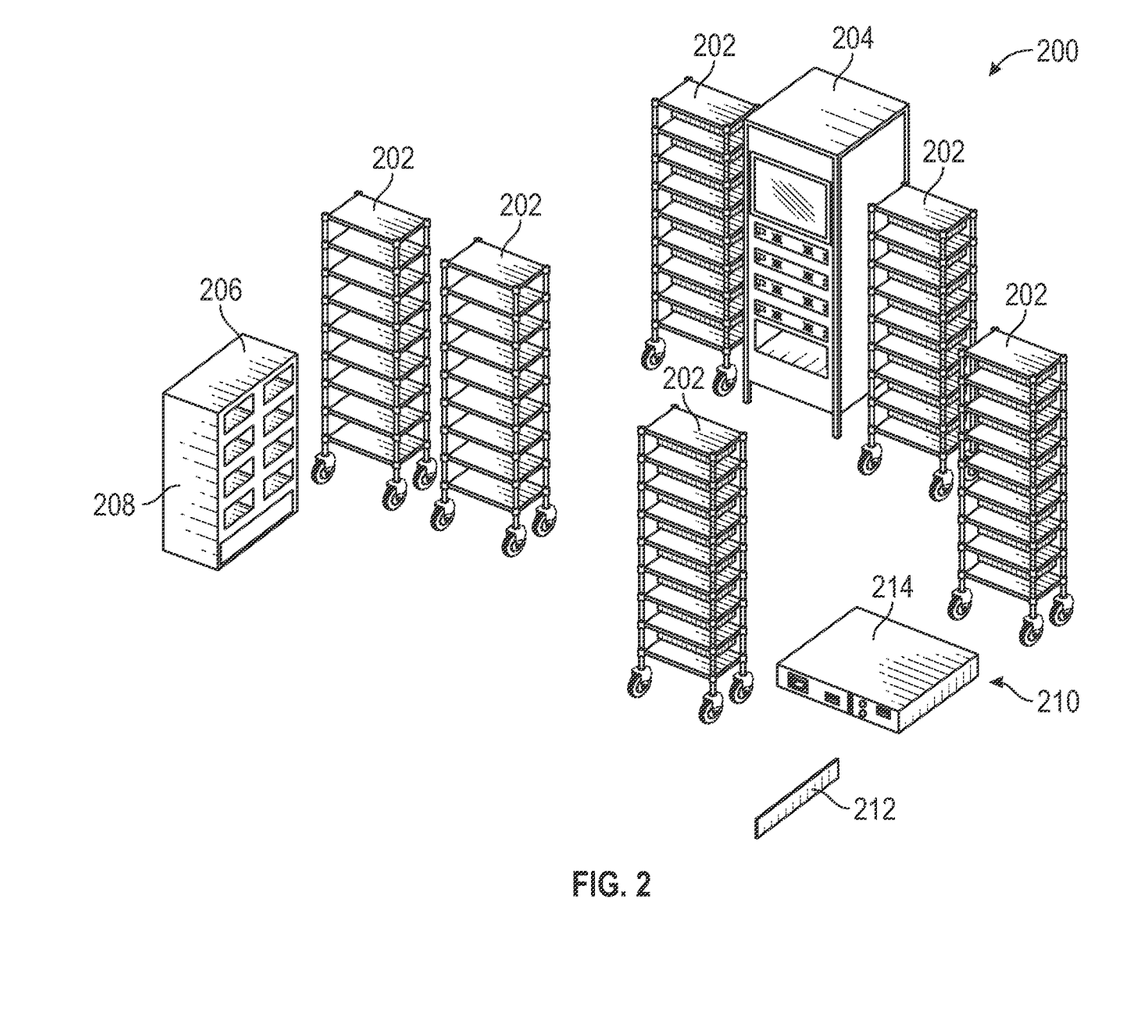
FIG. 2 is a diagram illustrating an example platform with rolling racks connected to an active testing system and rolling racks being loaded and unloaded away from the active testing system.

FIG. 2 is a diagram illustrating an example of a testing platform 200 with rolling racks 202 connected to an active testing system 204. As illustrated in FIG. 2, rolling racks 202 may be loaded and/or unloaded away from the active testing system 204. For example, set-top boxes (STBs) 206 that have not yet been tested may be located in a loading area 208. The STBs 206 may be loaded in or near the loading area 206. After the STBs are loaded on the rolling racks 202, the rolling racks 202 may be connected to the active testing system 204 and tested and/or functionally verified. After the STBs 206 are tested and/or functionally verified, they may be unloaded in an unloading area 210 and sorted, for example, into a pass category and a fail category. STBs 206 in the pass category may be placed in a pass area 212 and may be returned to service. STBs 206 in the fail category may be placed in a fail area 214 and may be marked for repair or warranty action or discarding.

Figure 3:
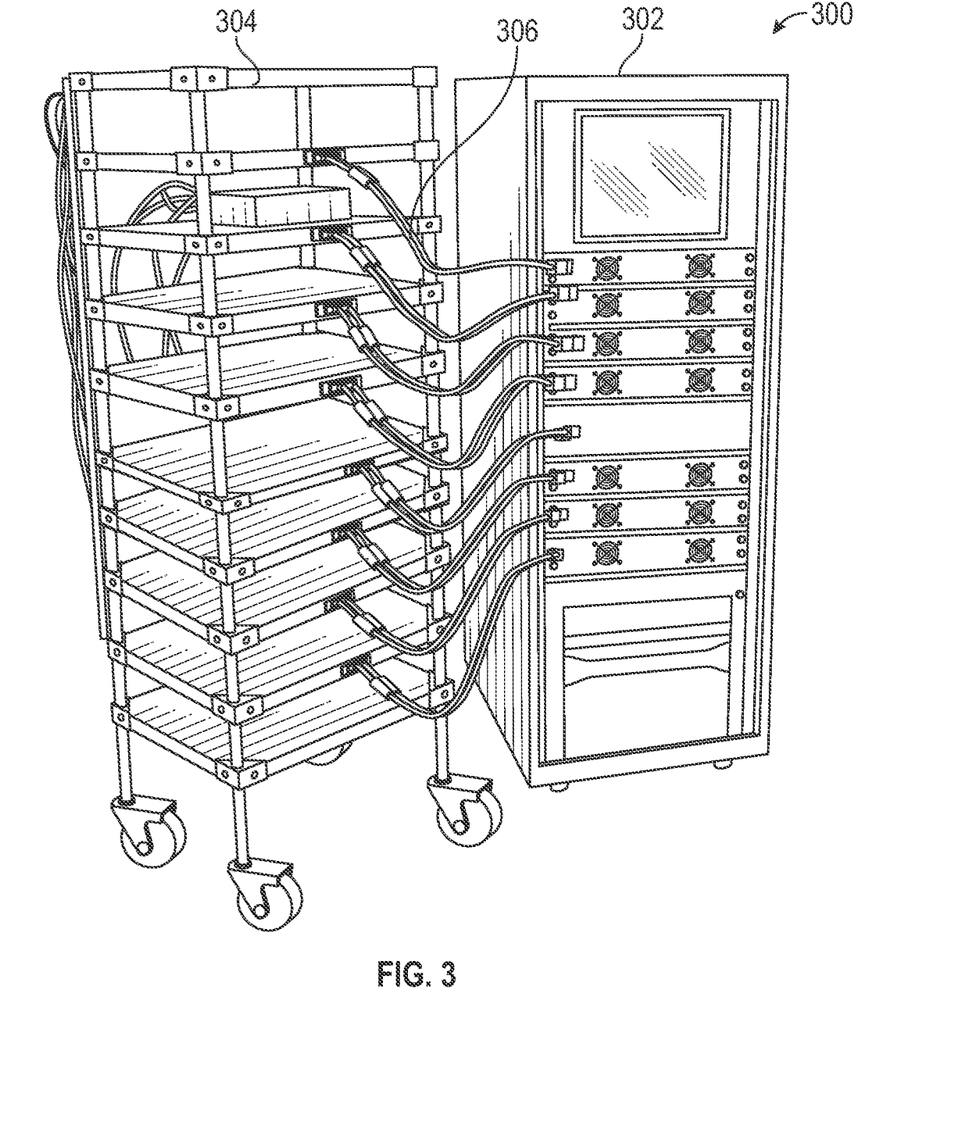
FIG. 3 is a diagram illustrating an example setup of a platform with a central node, rolling rack, quick connect cabling, and connectors.

FIG. 3 is a diagram illustrating an example of a testing platform 300. The testing platform 300 may comprise a central node 302, which may comprise test and/or diagnostic equipment. The central node 302 may also include a number of interfaces, including, but not limited to, an S-Video interface, a component video interface, a composite video interface, two separate stereo analog audio interfaces, two digital audio interfaces, an infrared control interface, and/or an interface for an RJ-11 phone interface for a Telco return. These interfaces may be aggregated at a single interface, such as an HDMI interface. It will be appreciated that other interface types may be used to aggregate the interfaces of the central node 302.

Figure 4:
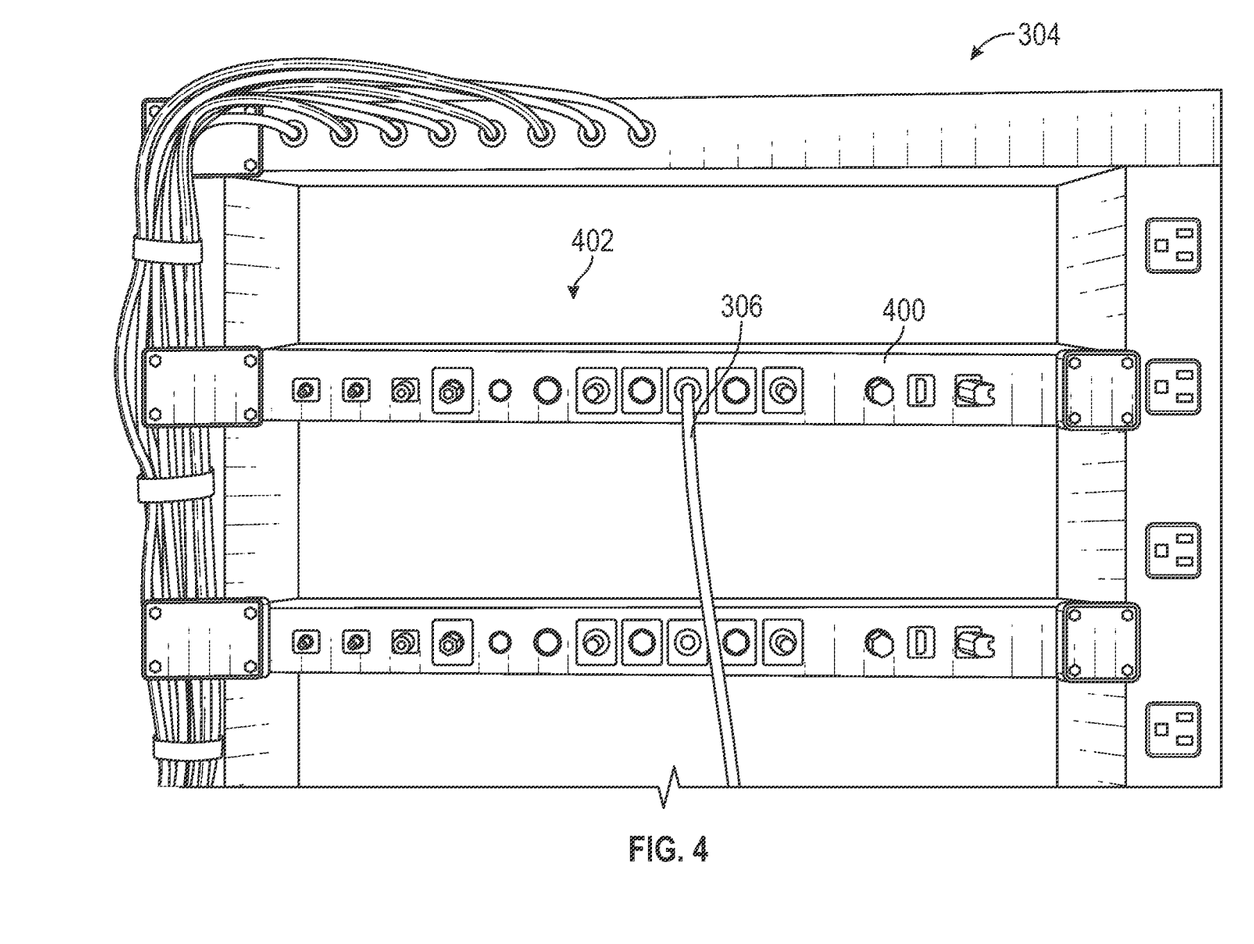
FIG. 4 is a diagram illustrating a universal platform shelf of a rolling rack having a plurality of interfaces.

The central node 302 may be connected to a rolling rack 304 via cabling, e.g., quick connect cabling 306. The rolling rack 304 may comprise a number of shelves. FIG. 4 is a diagram illustrating an example of a universal platform shelf 400 of the rolling rack 304. The universal platform shelf 400 may comprise a number of interfaces 402 located along an edge of the universal platform shelf 400 to interface with a CPE device. These interfaces 402 may comprise, but are not limited to, for example, an S-Video interface, a component video interface, a composite video interface, two separate stereo analog audio interfaces, two digital audio interfaces, an infrared control interface, and/or an interface for an RJ-11 phone interface for a Telco return. Along an opposite edge of the universal platform shelf 400 (not shown in FIG. 4), an aggregate interface, such as an HDMI interface, may be used to receive the quick connect cabling 306, which may be implemented, for example, as an HDMI cable, to interface with the central node 302.

Figure 5:
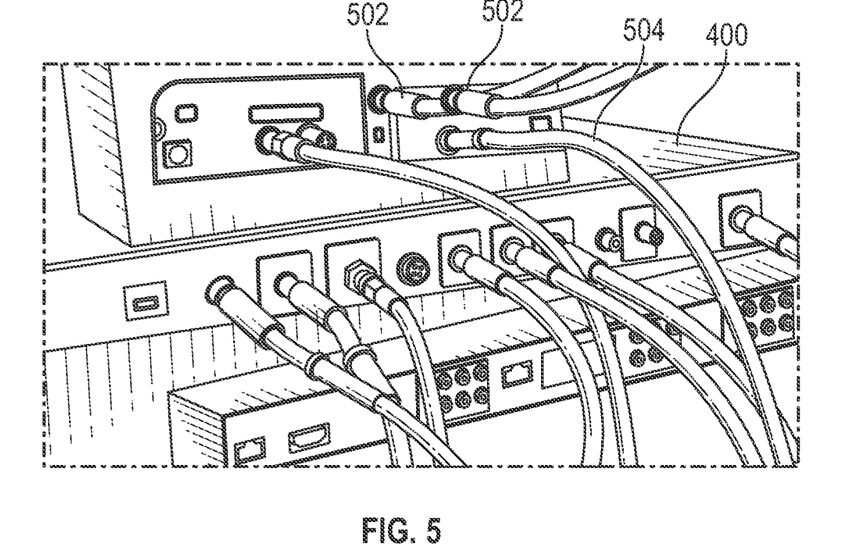
FIG. 5 is a diagram illustrating a universal platform shelf of a rolling rack with a CPE device connected to a platform away from an active testing system.

FIG. 5 is a diagram illustrating an example of a CPE device 500 connected to the universal platform shelf 400 of the rolling rack 304. The CPE device 500 may comprise a number of interfaces 502, such as, for example, an S-Video interface, a component video interface, a composite video interface, two separate stereo analog audio interfaces, two digital audio interfaces, an infrared control interface, and/or an interface for an RJ-11 phone interface for a Telco return. Other interface types may be employed by the CPE device 500. The interfaces of the CPE device 500 may be connected to corresponding interfaces of the universal platform shelf 400 using appropriate cabling 504. This connection may be performed away from the active testing system 204 of FIG. 2 to reduce the downtime of the active testing system 204.

Figure 6:
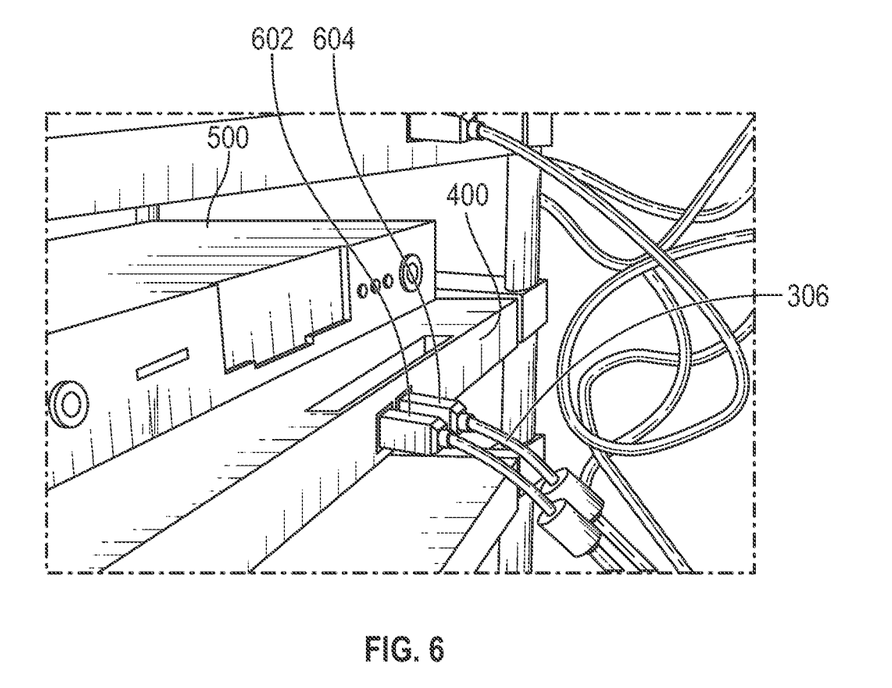
FIG. 6 is a diagram illustrating a universal platform shelf of a rolling rack with a two-cable quick connect of a CPE device to an active testing system.

FIG. 6 is a diagram illustrating an example of the CPE device 500 connected to the active testing system 204 of FIG. 2 (not shown in FIG. 6) via the universal platform shelf 400 of the rolling rack 304 and the quick connect cabling 306 of FIG. 3. The connection scheme shown in FIG. 6 employs two quick connect cables; however, it will be appreciated that more or fewer quick connect cables may be used. The quick connect cabling 306 may terminate in connectors 602 and 604 that are compatible with corresponding interfaces of the universal platform shelf 400 and the active testing system 204. For example, the quick connect cabling 306 may terminate in HDMI connectors. It will be appreciated that the quick connect cabling 306 may terminate in a connector of a different type at either or both ends for compatibility with other types of interfaces 602 and/or 604. The use of HDMI cables and connectors may promote reduction of signal interference and may promote compatibility with a wide variety of interfaces. The use of HDMI cables and connectors may also promote reduced manufacturing costs relative to proprietary connector types.

Using the quick connect cabling 306 to connect content CPE devices, such as TV set-top boxes, cable modems, Embedded Multimedia Terminal Adapters (EMTAs), wireless gateways, DSL modems, or devices that combine any of these and other capabilities in an integrated package, each of which may make use of a plurality of interfaces, to the active testing system 204, may be significantly easier and faster than using individual connections of the individual interfaces. For example, considering a CPE device that employs a component video interface, the number of connections that are to be made manually may be reduced from five to one.

The quick connect cabling 306 is easy to insert, high quality, robust, and designed for multiple or repeated insertion. Accordingly, insertion of the quick connect cabling 306 may involve less manual effort to establish a connection relative to some conventional cables. The interface connectors may have a higher operational life than some conventional connectors and may have a better operational usage profile for the life cycle of hundreds of thousands of connections with the active testing system 204 and CPE devices.

HDMI cables and connectors may be readily replaced when they wear out, promoting a longer operational life for high-volume device testing systems.

As demonstrated by the foregoing discussion, the disclosed subject matter may provide certain advantages, particularly in the context of high-volume testing. For example, connecting and disconnecting CPE devices to rolling racks away from an active testing platform may increase the uptime of the active testing platform. The connection and disconnection process can be performed in parallel with the functional verification process, further improving throughput. This may facilitate high-volume processing of devices to be tested.

It will be understood by those who practice the disclosed subject matter and those skilled in the art that various modifications and improvements may be made without departing from the spirit and scope of the disclosed subject matter. The scope of protection afforded is to be determined solely by the claims and by the breadth of interpretation allowed by law.

What is claimed is:

1. A method of conducting functional verifications, the method comprising:
   a) loading a first CPE device on a first test apparatus comprising a first connector interface
   b) connecting the first CPE device to the first test apparatus;
   c) using a cable to electrically connect the first connector interface to a corresponding second connector interface of a test platform;
   d) performing a functional verification test of the first CPE device;
   e) disconnecting the first connector interface from the second connector interface;
   f) electrically disconnecting the first CPE device from the test apparatus;
   g) unloading the CPE device from the test apparatus
   h) loading a second CPE device on a second test apparatus comprising a third connector interface;
   i) electrically connecting the second CPE device to the second test apparatus;
   j) electrically connecting the third connector interface to a fourth connector interface of the test platform;
   k) performing a functional verification test of the second CPE device;
   l) disconnecting the third connector interface from the fourth connector interface
   m) electrically disconnecting the second CPE device from the second test apparatus; and
   n) unloading the second CPE device from the second test apparatus, wherein:
      a step selected from a group consisting of steps (i)-(n) is performed in parallel with step (a), or a step selected from a group consisting of steps (h) and (i)-(n) is performed in parallel with step (b) or a step selected from a group consisting of steps (h)-(i) and (k)-(n) is performed in parallel with step (c).

2. The method of claim 1, wherein electrically connecting the first CPE device to the test apparatus comprises connecting a plurality of wiring interfaces.

3. The method of claim 2, wherein the plurality of wiring interfaces comprises at least one of an S-Video interface, a component video interface, a composite video interface, a stereo analog audio interface, a digital audio interface, an infrared control interface, or an RJ-11 phone interface.

4. The method of claim 1, wherein the first connector interface comprises a High Definition Multimedia Interface (HDMI).

5. The method of claim 1, further comprising classifying the first CPE device as a function of a result of the functional verification test.

6. The method of claim 5, wherein classifying the first CPE device comprises classifying the first CPE device for at least one of return to service, repair, warranty action, or discard.

7. The method of claim 1, wherein the step selected from the group is step k.

8. The method of claim 1, wherein the step selected from the gorup is step j.

9. A method of conducting functional verification of customer premise equipment (CPE) devices, the method comprising:
  a) loading a plurality of CPE devices on a first test apparatus comprising a first connector interface;
  b) electrically connecting the plurality of CPE devices to the test apparatus;
  c) electrically connecting the first connector interface to a corresponding second connector interfaceof a test platform;
  d) performing functional verification tests of the plurality of CPE devices;
  e) disconnecting the first connector interfaces from the second connector interface;
  f) electrically disconnecting the plurality of CPE devices from the first test apparatus;
  g) unloading the plurality of CPE devices from the test apparatus;
  h) loading a second plurality of CPE devices on a second test apparatus comprising a third connector interface;
  i) electrically connecting the second plurality of CPE device to the second test apparatus;
  j) electrically connecting the third connector interface to a fourth connector interface of the test platform;
  k) performing a functional verification test of the second plurality of CPE device;
  l) disconnecting the third connector interface from the fourth connector interface;
  m) electrically disconnecting the second plurality of CPE devices from the second test apparatus; and
  n) unloading the second plurality of CPE devices from the second test apparatus, wherein:
    a step selected from a group consisting of steps (i)-(n) is performed in parallel with step (a),
    a step selected from a group consisting of steps (h) and (j)-(n) is performed in parallel with step (b), or
    a step selected from a group consisting of steps (h)-(i) and (k)-(n) is performed in parallel with step (c).

10. The method of claim 9, further comprising classifying the CPE devices as a function of results of the functional verification tests.

11. The method of claim 10, wherein classifying the CPE devices comprises classifying the CPE devices for at least one of return to service, repair, warranty action, or discard.

12. The method of claim 9, wherein the first connector interface comprises a High Definition Multimedia Interface (HDMI).

13. The method of claim 9, wherein the step selected from the group is step k.

14. The method of claim 9, wherein the step selected from the gorup is step j.

* * * * *

UNITED STATES PATENT AND TRADEMARK OFFICE
CERTIFICATE OF CORRECTION

| | |
|---|---|
| PATENT NO. | : 10,976,359 B2 |
| APPLICATION NO. | : 13/987766 |
| DATED | : April 13, 2021 |
| INVENTOR(S) | : Foad Towfiq et al. |

It is certified that error appears in the above-identified patent and that said Letters Patent is hereby corrected as shown below:

In the Claims

In Claim 8, at Column 13, Line 26, delete "gorup" and insert -- group --, therefor.

In Claim 9, at Column 13, Line 35, delete "interfaceof" and insert -- interface of --, therefor.

In Claim 14, at Column 14, Line 39, delete "gorup" and insert -- group --, therefor.

Signed and Sealed this
Tenth Day of May, 2022

Katherine Kelly Vidal
*Director of the United States Patent and Trademark Office*